United States Patent [19]
Correa

[11] Patent Number: 5,479,874
[45] Date of Patent: Jan. 2, 1996

[54] CVD DIAMOND PRODUCTION USING PREHEATING

[75] Inventor: Sanjay M. Correa, Schenectady, N.Y.

[73] Assignee: General Electric Company, Schenectady, N.Y.

[21] Appl. No.: 306,077

[22] Filed: Sep. 14, 1994

Related U.S. Application Data

[62] Division of Ser. No. 128,330, Sep. 29, 1993, abandoned.

[51] Int. Cl.⁶ .................................................. C30B 25/08
[52] U.S. Cl. .............................. 117/84; 117/89; 118/724
[58] Field of Search ................................ 117/79, 84, 89, 117/929; 118/724, 725

[56] References Cited

U.S. PATENT DOCUMENTS

| 3,580,732 | 5/1971 | Blakeslee et al. | 117/79 |
| 4,953,499 | 9/1990 | Anthony et al. | 117/929 |
| 4,970,986 | 11/1990 | Anthony et al. | 118/724 |

FOREIGN PATENT DOCUMENTS

| 0587817 | 1/1983 | Japan . |
| 63-285192 | 3/1989 | Japan . |

Primary Examiner—R. Bruce Breneman
Assistant Examiner—Felisa Garrett
Attorney, Agent, or Firm—Paul R. Webb, II

[57] ABSTRACT

A filament reactor for producing diamond using chemical vapor deposition (CVD) techniques. The reactor includes a closed reaction chamber with at least one gas inlet and at least one exhaust port, two substrates disposed in the reaction chamber, and a resistance heating device in the form of a plurality of filaments positioned between the substrates. A preheater unit is located adjacent to the gas inlet for heating the gas mixture entering the reaction chamber. By preheating the gas mixture, the temperature of the substrates and the concentration of the hydrocarbon species fluxes are kept relatively uniform, thus ensuring high quality diamonds of uniform thicknesses. The preheater unit can be a serpentine tube made of a metal having a high thermal conductivity and wrapped with a resistance heating element.

2 Claims, 2 Drawing Sheets

CVD DIAMOND PRODUCTION USING PREHEATING

This application is a division, of application Ser. No. 08/128,330, filed Sep. 9, 1993, abandoned.

BACKGROUND OF THE INVENTION

This invention relates generally to an improved chemical vapor deposition (CVD) apparatus for the nucleation and growth of diamond crystals and more particularly concerns a CVD apparatus having a preheater for heating the stream of feedstock as it enters the apparatus.

Various methods are known for the synthetic production of diamond. One method utilizes CVD techniques. In such a process, a gas mixture of hydrogen and a hydrocarbon such as methane is used as feedstock. The gas mixture is heated to the appropriate dissociation temperature whereupon the hydrogen is converted to atomic hydrogen and the original hydrocarbon is converted to various intermediate hydrocarbon radicals (such as $CH_3$, $CH_2$, $CH$, etc. when methane is used). A substrate is provided and positioned so as to be impinged with hydrogen atom and hydrocarbon radical species fluxes. The substrate is maintained at a temperature which promotes nucleation and growth of diamond from the hydrocarbon radicals deposited thereon. To obtain high quality diamond with uniform thickness, it is necessary that the temperature of the substrate and the fluxes of hydrogen atoms and hydrocarbon species impinging the substrate be kept as uniform as possible.

FIGS. 1A and 1B show a conventional apparatus 10, (referred to herein as a "filament reactor") which uses CVD techniques to produce diamond. The filament reactor 10 of FIGS. 1A and 1B comprises a reaction chamber 12 having a gas inlet 14 and an exhaust port 16. Two substrates 18 are located in the reaction chamber 12 in a spaced apart, parallel relationship. A plurality of heating filaments 20 is positioned in the space between the two substrates 18. The filaments 20 are connected between a pair of electrodes 22 which in turn are connected to a power source (not shown). When activated, the power source generates an electrical current through the electrodes and the filaments causing the filaments to produce heat. In practice, a hydrogen/hydrocarbon gas mixture is caused to flow into the reactor chamber 12 via gas inlet 14 and to flow between the two substrates 18. The filaments 20 are provided with an electrical current from the power source sufficient to heat the filaments 20 to the necessary temperature.

The filaments 20 must heat both the gas mixture to dissociation temperatures and the substrates to the narrow band of temperatures conducive to the nucleation and growth of diamond crystals. The filament temperatures must be controlled with a high degree of precision to meet these two objectives given the complexities of convective and diffusive heat transport, radiation, exothermic hydrogen atom recombination and large density variations. This is particularly true for conventional filament reactors because the gas mixture enters the reaction chamber 12 at room temperature, which is considerably cooler than the temperature of the filaments.

The relatively cool inlet temperature of the gas mixture creates other difficulties as well. As the cool gas mixture passes over the filaments 20 (from left to right as seen in FIG. 1A) to be heated, the mixture absorbs more heat from the forward (left most) filaments than from the rear (right most) filaments. Since less heat is transferred to the gas from the rear filaments, the rear portions of the substrates 18 are heated more than the forward portions, thus creating temperature gradients across the substrates. These temperature gradients ultimately lead to non-uniform thicknesses in the diamond produced on the substrates, often to the point of adversely affecting the commercial value of the product.

Another problem arises due to the large difference between the inlet and filament temperatures. When the cool gas mixture impinges on the filaments 20 between the two substrates 18, it is rapidly heated from room temperature to a temperature on the order of 2000° C. This rapid temperature elevation causes a large volumetric expansion in the space between the two substrates. The volumetric expansion creates a pressure drop which tends to cause the flow of gas mixture to by-pass the region between the substrates, thus depriving the region of fresh hydrogen/hydrocarbon gas mixture. This deprivation causes inconsistent hydrogen atom and hydrocarbon species concentrations which hamper diamond production and quality.

SUMMARY OF THE INVENTION

Accordingly, it is an object of the present invention to provide a filament reactor which avoids the problems associated with cool gas inlet temperatures.

More specifically, it is an object of the present invention to provide a filament reactor which has a preheater unit that raises the temperature of the inlet gas.

In addition, it is an object of the present invention to maintain a uniform temperature across the substrate or substrates.

It is another object of the present invention to minimize the volumetric expansion of the gas mixture between the substrates.

These and other objects are accomplished in the present invention by providing a filament reactor having a closed reaction chamber with at least one gas inlet and at least one exhaust port, at least one or two substrates disposed in the reaction chamber, a plurality of resistance heating filaments positioned adjacent to the substrates, and a preheater unit located by the gas inlet for heating the gas mixture entering the reaction chamber through the gas inlet. The preheater unit can comprise a serpentine tube made of a metal having a high thermal conductivity and wrapped with a resistance heating element or an inductive-radio frequency coupled glass tube.

Other objects and advantages of the present invention will become apparent upon reading the following detailed description and the appended claims and upon reference to the accompanying drawings.

DESCRIPTION OF THE DRAWINGS

The subject matter which is regarded as the invention is particularly pointed out and distinctly claimed in the concluding portion of the specification. The invention, however, may be best understood by reference to the following description taken in conjunction with the accompanying drawing figures in which:

DETAILED DESCRIPTION OF THE INVENTION

Figure 1A:
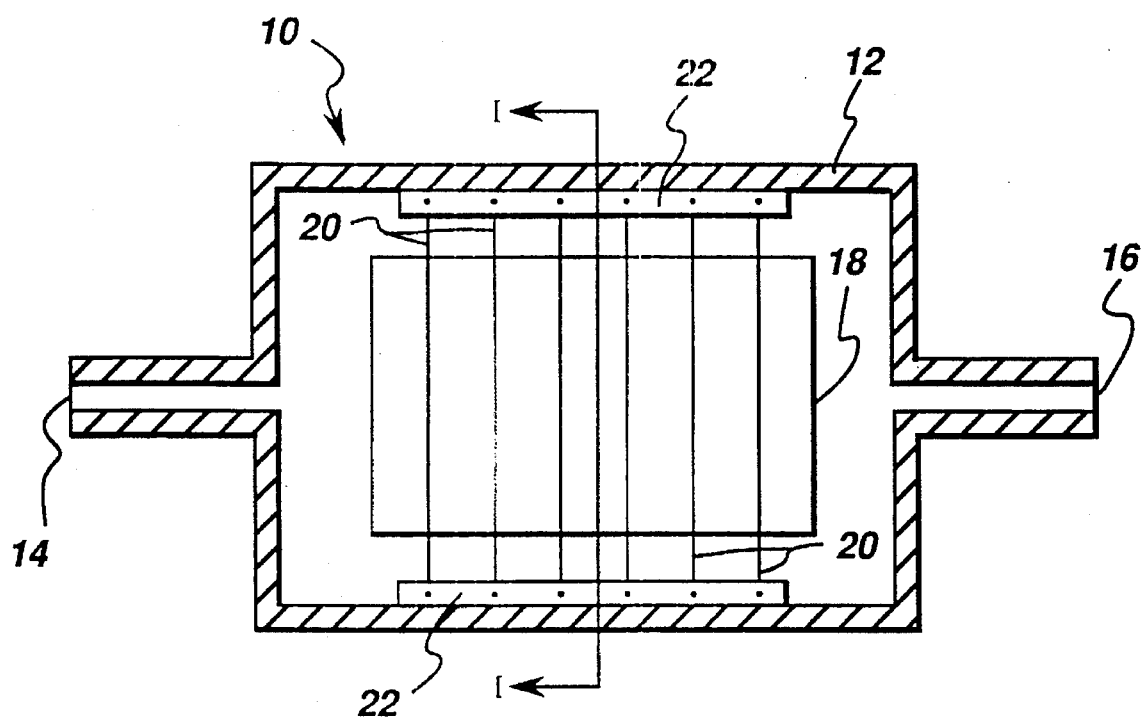
FIG. 1A is a cross-sectional side view of a conventional filament reactor.
Figure 1B:
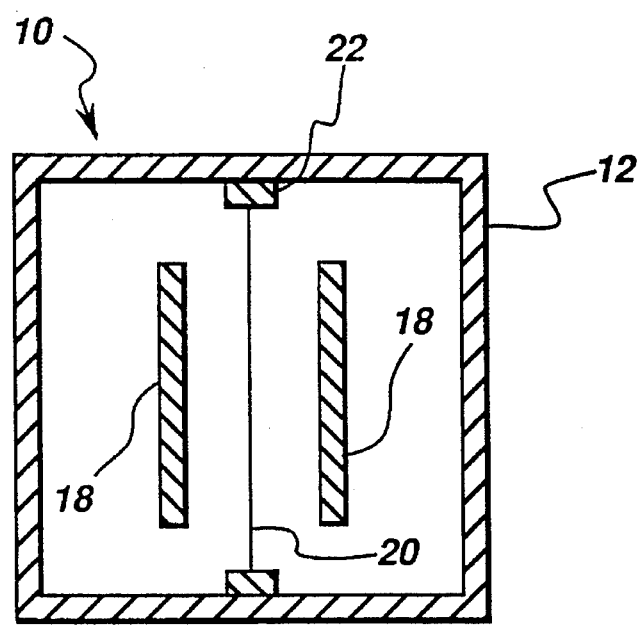
FIG. 1B is a cross-sectional view of the conventional filament reactor taken along line I—I of FIG. 1A.
Figure 2:
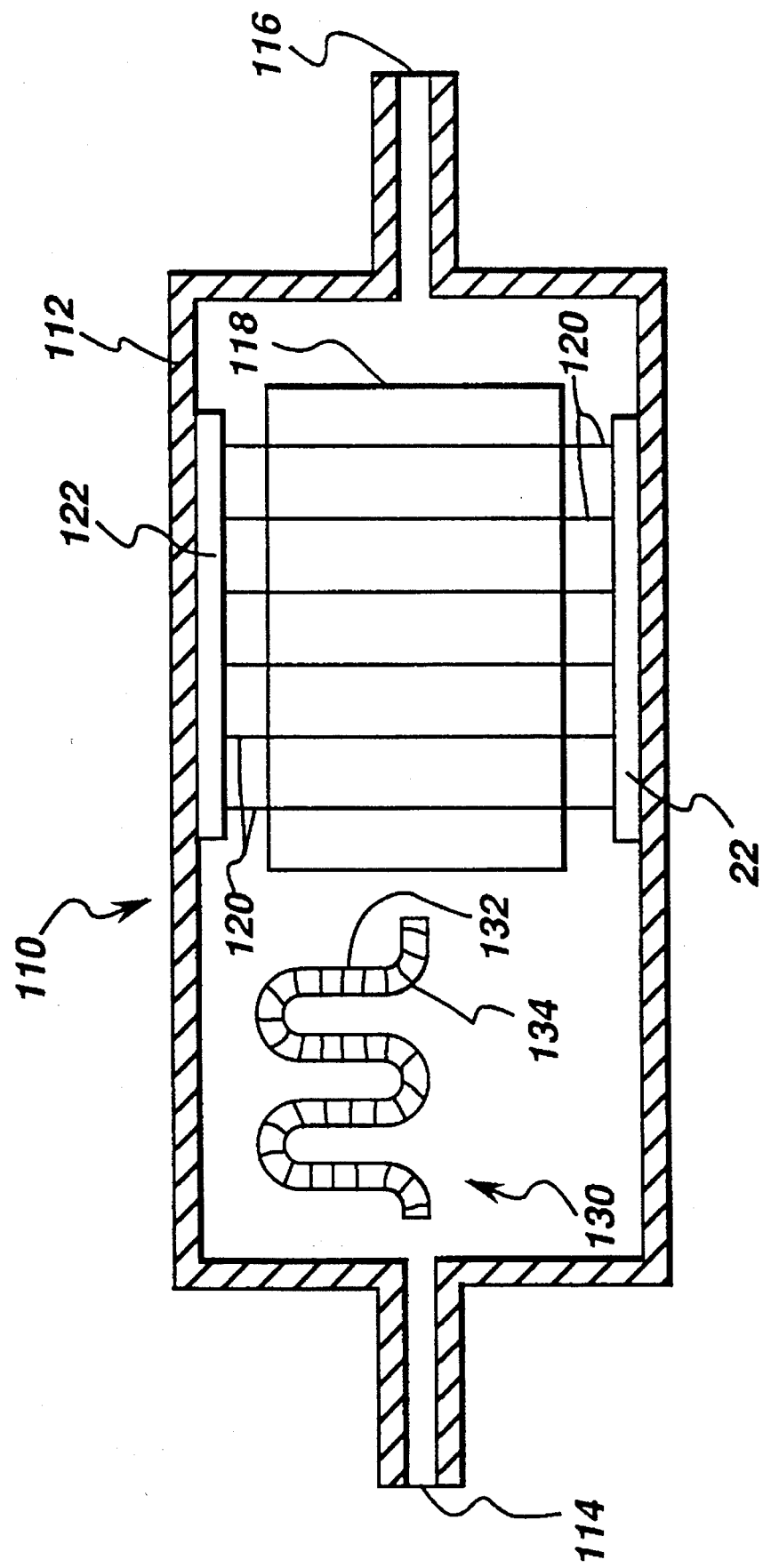
FIG. 2 is a cross-sectional side view of the filament reactor of the present invention.

FIG. 2 shows the filament reactor 110 of the present invention which includes the basic elements of the conventional device 10 shown in FIGS. 1A and 1B. The filament reactor 110 comprises a reaction chamber 112 having a gas inlet 114 and an exhaust port 116, two substrates 118, and a resistance heating means having two electrodes 122 and a plurality of heating filaments 120 connected therebetween. The electrodes 122 are connected to a power source (not shown) which, when activated, generates an electrical current that causes the filaments to produce heat. The reaction chamber 112 is an air-tight enclosure capable of being maintained at pressures less than atmospheric. The reaction chamber 112 is constructed of a high temperature resistant material able to withstand temperatures on the order of about 1000° C. Quartz is a good example of a non-conductive, heat-resistant material appropriate for this purpose.

The present invention can be carried out using only one substrate although the use of two is preferred in order to more fully exploit the hydrocarbon species fluxes generated by the dissociation of the gas mixture. The substrates 118, which are typically planar (although slight curvatures are acceptable), are arranged in a spaced-apart, parallel relationship. The substrates 118 may be made of any material suitable for carbon deposition thereon and capable of withstanding temperatures in the range of about 700°–1000° C., the optimum diamond deposition temperature range. Molybdenum is a suitable substrate material.

The filaments 120 are located between the substrates 118, parallel to and substantially equidistant therefrom. The filaments 120 must be capable of sustaining temperatures on the order of 2000° C. to sufficiently heat the gas mixture. Since the filaments 120 must also heat the substrates 118 to the optimum deposition temperature in the range of about 700°–1000° C., they are appropriately spaced from the substrates 118 so as not to overheat them. The number and composition of the filaments is not critical to the present invention. Any number of filaments as needed can be used and any known filament material is acceptable. Examples of appropriate materials are tungsten, tantalum, molybdenum, and rhenium.

The improvement of the present invention lies in the inclusion of a preheater unit 130. As shown in FIG. 2, the preheater unit is enclosed within the reactor chamber 112, although this is not necessary. The preheater unit 130 is located near the gas inlet 114 so that the gas mixture is heated by the preheater unit as it enters the reaction chamber 112. The temperature to which the gas mixture is preheated will be optimized by trial-and-error on a case-by-case basis but will generally be equivalent to the optimal diamond deposition temperature of the substrates 118, which is in the range of about 700°–1000° C. Since the gas mixture is preheated to a temperature close to the temperature of the substrates 118, the filaments 120 heat the gas mixture to a temperature of about 2000° C. from only about 700°–1000° C. instead of from room temperature. The smaller temperature elevation results in a smaller volumetric expansion between the substrates 118. Thus, the problem of fresh gas mixture by-passing the region between the substrates which causes a deprivation of hydrocarbon species flux is largely avoided. The problem of non-uniform substrate temperatures is also relieved to a great extent because the leveling of the temperature difference reduces the disproportionate heating load on the forward-most filaments.

The preheater unit 130 can be any known heating device capable of sufficiently heating gas mixtures at flow rates on the scale of a few grams per second. One preferred embodiment of the preheater unit 130 comprises a serpentine tube 132 made of a metal having a high thermal conductivity. One end of the metal tube 132 is aligned with the gas inlet 114 so that the gas mixture entering the reaction chamber via the inlet 114 is funnelled into the tube 132. The other end of the tube 132 is pointed in the direction of the filaments 120 and the substrates 118 so exiting gas will pass over these elements. An electrical resistance heating element 134 is wrapped around the tube 132 and connected to a power source (not shown). When the power source is activated, the heating element heats the metal tube 132 which, due to its high thermal conductivity, readily transfers the heat to the gas therein.

Other heating arrangements are possible. For instance, the metal tube 132 would not be feasible if a gas mixture having constituents which adversely reacted with the metallic substance was used. In such a case, a preheater unit comprising an inductive radio frequency coupled glass tube could be employed.

In operation, the reaction chamber 112 is maintained at a pressure on the order of about 10 torr. A gas mixture of hydrogen and a hydrocarbon, most often methane present in an amount of about 2–5% of the total mixture, is introduced into the reaction chamber 112 via the gas inlet 114. The gas mixture passes through the preheater unit 130 where it is heated to a temperature in the range of about 700°– 1000 ° C. Meanwhile a current is passed through the electrodes 122 and the filaments 120 to heat the filaments to a temperature of at least about 2000° C. The hot filaments maintain the substrates 118 at the optimum diamond deposition temperature which is in the range of about 700°–1000° C. The preheated flow of gas mixture comes in contact with the hot filaments and is further heated to dissociation temperatures. The resulting hydrocarbon species are deposited on the substrates. Due to the preheating of the gas mixture, the temperature of the substrates and the concentration of the hydrocarbon species fluxes are kept relatively uniform, and excellent nucleation and growth of diamond are promoted.

The foregoing has described an improved filament reactor for producing diamond using CVD techniques. By preheating the gas mixture feedstock, the device of the present invention produces diamonds of uniform thickness and better quality.

While specific embodiments of the present invention have been described, it will be apparent to those skilled in the art that various modifications thereto can be made without departing from the spirit and scope of the invention as defined in the appended claims.

What is claimed is:

1. A method of producing diamond by chemical vapor deposition comprising the steps of:

providing a reaction chamber having at least one substrate therein;

introducing a hydrogen/hydrocarbon gas mixture into said reactor chamber;

heating said substrate to a temperature within a temperature range for effecting diamond deposition thereon from said gas mixture;

preheating said gas mixture as it enters said reaction chamber to about said substrate temperature to minimize initial temperature difference between said gas mixture and said substrate for maintaining a substantially uniform temperature across said substrate; and passing said preheated gas mixture over said substrate while concurrently heating said gas mixture to its dissociation temperature.

2. A method of producing diamond by chemical vapor deposition comprising the steps of:

provinding a reaction chamber having at least one substrate therein;

introducing a hydrogen/hydrocarbon gas mixture into said reactor chamber;

heating said substrate to a temperature within a temperature range of about 700°–1000° C. for effecting diamond deposition thereon from said gas mixture;

preheating said gas mixture as it enters said reaction chamber to about said substrate temperature to minimize initial temperature difference between said gas mixture and said substrate for maintaining a substantially uniform temperature across said substrate; and passing said preheated gas mixture over said substrate while concurrently heating said gas mixture to its dissociation temperature.

* * * * *